United States Patent [19]

Matsumoto

[11] Patent Number: 4,743,955
[45] Date of Patent: May 10, 1988

[54] PHOTOELECTRIC CONVERTING DEVICE

[75] Inventor: Shigeyuki Matsumoto, Atsugi, Japan

[73] Assignee: Canon Kabushiki Kaisha, Tokyo, Japan

[21] Appl. No.: 855,682

[22] Filed: Apr. 25, 1986

[30] Foreign Application Priority Data

May 1, 1985 [JP] Japan .................................. 60-92291

[51] Int. Cl.$^4$ ...................... H01L 27/14; H01L 31/10
[52] U.S. Cl. .......................................... 357/30; 357/31; 357/32; 357/45
[58] Field of Search ...................... 357/30, 31, 32, 45

[56] References Cited

U.S. PATENT DOCUMENTS

3,624,428 11/1971 Weimer et al. .................... 357/23.6

FOREIGN PATENT DOCUMENTS

| | | |
|---|---|---|
| 132076 | 1/1985 | European Pat. Off. . |
| 57-145368 | 9/1982 | Japan ..................................... 357/30 |
| 59-152662 | 8/1984 | Japan . |
| 60-163474 | 8/1985 | Japan ..................................... 357/45 |
| 60-206061 | 10/1985 | Japan . |

*Primary Examiner*—Andrew J. James
*Assistant Examiner*—Jerome Jackson
*Attorney, Agent, or Firm*—Fitzpatrick, Cella, Harper & Scinto

[57] ABSTRACT

A photoelectric device comprises a plurality of photoelectric converting cells. Each of the cells has a semiconductor transistor consisting of two main electrode regions formed of a semiconductor of one conductivity type and a control electrode region formed of a semiconductor of the opposite conductivity type and a capacitor for controlling a potential of the control electrode region in the floating state. Each of the photoelectric converting cells accumulates carriers generated due to an incident light into the control electrode region and controls an output by a voltage generated due to the accumulated carriers by controlling the potential of the control electrode region in the floating state through the capacitor. Each of the photoelectric converting cells consists of a first portion having a high photoelectric converting efficiency and a second portion which is formed with at least an electrode of the capacitor and an electrode of the other main electrode regions, and a width of the first portion is formed narrower than a width of the second portion and the first portion is arranged in a line.

2 Claims, 6 Drawing Sheets

FIG. 2B
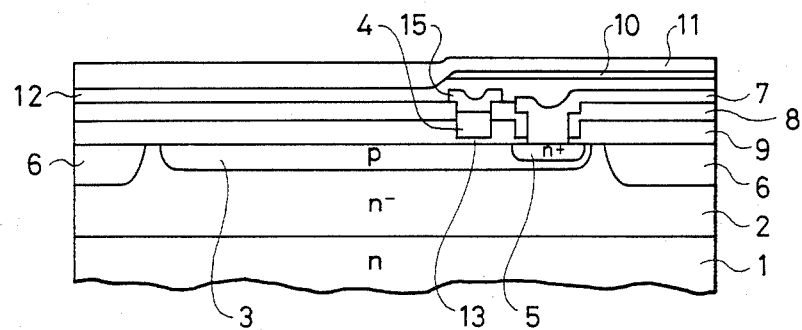
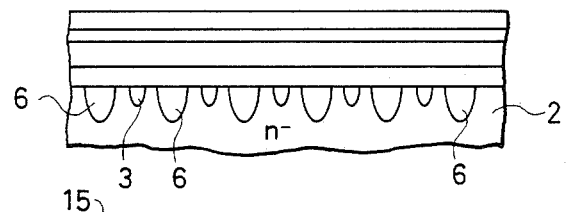
FIG. 2C
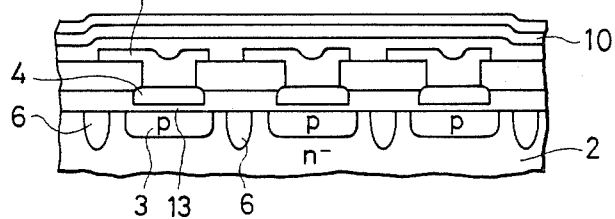
FIG. 2D
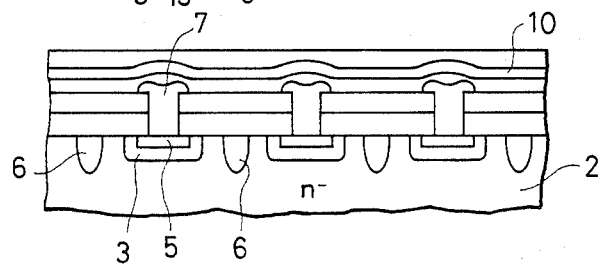
FIG. 2E

FIG. 4
FIG. 5
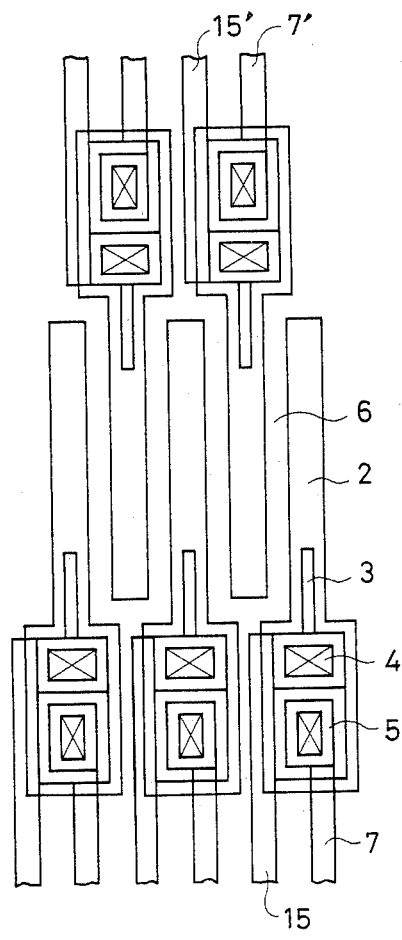
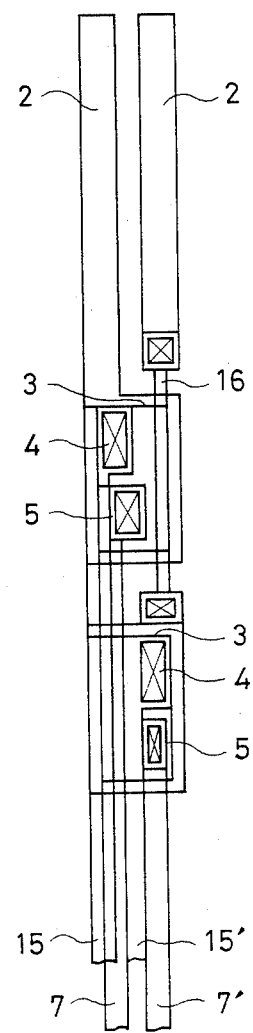

PHOTOELECTRIC CONVERTING DEVICE

BACKGROUND OF THE INVENTION

1. Field of the Invention

The present invention relates to a photoelectric converting device having a photocharge accumulating region whose potential is controlled through a capacitor.

2. Related Background Art

As a conventional photoelectric converting system, for example, there is the system disclosed in the Official Gazette of EPC Application Laid-Open No. 0132076.

FIG. 1A is a schematic plan view of the conventional photoelectric converting device disclosed in this Official Gazette and FIG. 1B is a cross sectional view taken along the line I—I in FIG. 1A.

In these diagrams, photosensor cells are formed and arranged on a substrate 101 in a line. Each of the photosensor cells is electrically insulated from the adjacent photosensor cells by an element isolating region 102.

Each photosensor cell has the following constitution.

An n⁻ epitaxial region (hereinafter, referred to as an n⁻ region) 103 is formed on the substrate 101. A p region 104 and an n⁺ region 105 are formed on and over the n⁻ region 103. The p region 104 and n⁺ region 105 serve as a base and an emitter of a bipolar transistor, respectively.

An oxide film 106 is formed over the n⁻ region 103 formed with those respective regions in this manner. A capacitor electrode 107 having a predetermined area is formed on the oxide film 106. The capacitor electrode 107 faces the p region 104 through the oxide film 106. A potential of the p region 104 in the floating state is controlled by applying a pulse potential to the capacitor electrode 107.

In addition, an emitter electrode 108 connected to the n⁺ region 105 is formed. An electrode (not shown) to apply a potential to a collector of the bipolar transistor through an n⁺ region having a high impurity concentration is formed on the back surface of the substrate 101.

The fundamental operation will now be described. A light enters the p region 104 as the base of the bipolar transistor. The charges corresponding to the incident light amount are accumulated into the p region 104 (accumulating operation). The base potential is changed due to the charges accumulated. A current flowing between the emitter and collector is controlled due to the potential change, so that an electrical signal corresponding to the incident light amount can be obtained (reading operation). On the other hand, to remove the charges accumulated in the p region 104, the emitter electrode 108 is grounded and a pulse of a positive voltage is applied to the capacitor electrode 107 (refreshing operation). By applying the positive voltage, the p region 104 is forwardly biased with respect to the n⁺ region 105 and the charges accumulated are removed. Thereafter, the respective accumulating, reading, and refreshing operations are repeated.

In other words, according to the system proposed in conventional device, the charges generated due to the incident light are accumulated into the p region 104 as the base and the current flowing between the emitter electrode 108 and the collector electrode is controlled by the amount of accumulated charges. Therefore, after the accumulated charges were amplified due to the amplifying function of each cell, they are read out. Thus, the high power, high sensitivity, and further low noise can be accomplished.

A potential Vp generated in the base by the holes accumulated in the base due to the light excitation is given by Q/C (namely, $V_p = Q/C$), wherein Q denotes an amount of charges of the holes accumulated in the base and C is a capacitance connected to the base. As will be apparent from this expression, in the case where elements are highly integrated, both Q and C decrease together with the reduction in the cell size, so that the potential Vp which is generated due to the light excitation is held almost constant. Therefore, the system proposed in the conventional device is also advantageous for the future high resolution.

However, according to the conventional photoelectric converting device, in the case of applying the design rule of 2 µm, for example, the contact portion on the emitter region 105 is limited to 2 µm, so that the width of 10 µm or more is needed per photo sensor cell. Therefore, in the case of arranging, e.g., 1000 cells in a line, the length of photoelectric converting device itself reaches 10 mm. Such a large device has the problems such that the yield deteriorates and the variation in characteristics of the cells becomes large. In addition, the resolution is limited by the design rule and it is difficult to attain high resolution.

SUMMARY OF THE INVENTION

It is an object of the present invention to provide a photoelectric converting device which can solve the problems in the conventional photoelectric converting device.

Another object of the invention is to provide a photoelectric converting device comprising a plurality of photoelectric converting cells which are arranged and each of which has: a semiconductor transistor consisting of two main electrode regions formed of a semiconductor of one conductivity type and a control electrode region formed of a semiconductor of the opposite conductivity type; and a capacitor to control a potential of the control electrode region in the floating state, wherein each of the photoelectric converting cells accumulates carriers generated due to the incident light into the control electrode region and controls an output by a voltage generated due to the accumulated carriers by controlling the potential of the control electrode region in the floating state through the capacitor, and each of the photoelectric converting cells is composed of a first portion having a high photoelectric converting efficiency and a second portion which is formed with at least an electrode of the capacitor and an electrode of the other main electrode regions, and a width of the first portion is narrower than a width of the second portion and the first portion is arranged in a line.

BRIEF DESCRIPTION OF THE DRAWINGS

FIG. 2B is a cross sectional view taken along the line B—B in FIG. 2A;

FIG. 2C is a cross sectional view taken along the line C—C in FIG. 2A;

FIG. 2D is a cross sectional view taken along the line D—D in FIG. 2A;

FIG. 2E is a cross sectional view taken along the line E—E in FIG. 2A;

FIG. 4 is a schematic plan view of the second embodiment of the invention; and

FIG. 5 is a schematic plan view of the third embodiment of the invention.

DETAILED DESCRIPTION OF PREFERRED EMBODIMENTS

An embodiment of the present invention will be described in detail hereinbelow with reference to the drawings.

Figure 2A:
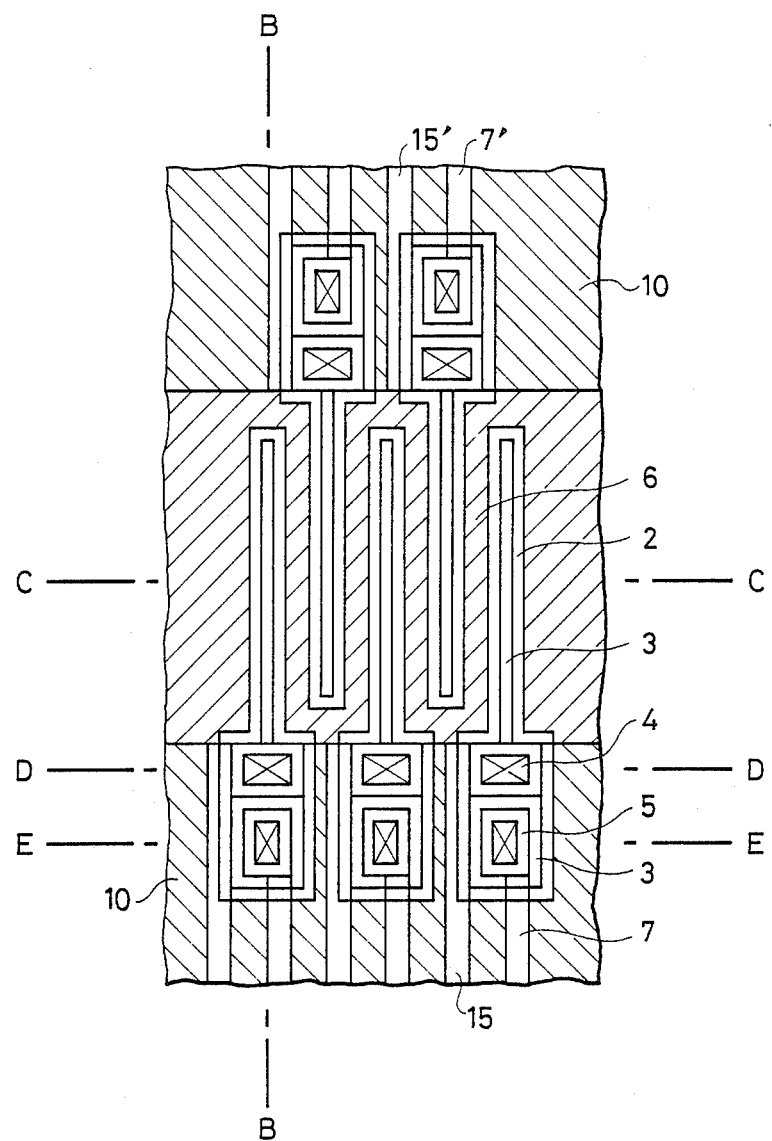
FIG. 2A is a schematic plan view of the first embodiment of a photoelectric converting device according to the present invention.

FIG. 2A is a schematic plan view of the first embodiment of a photoelectric converting device according to the present invention. FIG. 2B is a cross sectional view taken along the line B—B in FIG. 2A. FIG. 2C is a cross sectional view taken along the line C—C in FIG. 2A. FIG. 2D is a cross sectional view taken along the line D—D in FIG. 2A. FIG. 2E is a cross sectional view taken along the line E—E in FIG. 2A.

In those diagrams, an $n^-$ epitaxial layer 2 is formed on an n silicon substrate 1. Photo sensor cells electrically insulated from one another by an element isolating region 6 are arranged in the $n^-$ epitaxial layer 2.

In this embodiment, the element isolating region 6 was formed by diffusing impurities. However, the invention is not limited to this method. The element isolating region 6 may be also formed by the well-known techniques such as LOCOS method, method whereby impurities are diffused under the oxide film by way of the LOCOS method, SEG (selective epitaxial growth) method, bulk etching method, etc.

Each photosensor cell comprises:

A p base region 3 and an $n^+$ emitter region 5 of a bipolar transistor which are formed on and over the $n^-$ epitaxial layer 2;

a polysilicon layer 4 for an electrode which serves as an electrode of a capacitor to apply a pulse to the p base region 3 and an emitter electrode 7 connected to the $n^+$ emitter region 5, the polysilicon layer 4 and emitter electrode 7 being arranged so as to sandwich an oxide film 13; and an electrode 15 connected to the polysilicon layer 4 and a collector electrode (not shown) to apply a potential to a collector of the bipolar transistor through an $n^+$ region (not shown) having a high impurity concentration, this collector electrode being formed on the back surface of the substrate 1.

Further, an electrode section formed with the polysilicon layer 4 as the capacitor electrode and with the emitter electrode 7 is covered by a light shielding layer 10. A photosensing section is that portion which is formed by the base region 3 and $n^-$ epitaxial layer 2 and has a width thinner than the electrode portion.

The device of this embodiment fundamentally operates in a manner as follows. First, the p base region 3 biased to a negative potential is set to the floating state and the holes in the pairs of electrons and holes generated due to the light excitation are accumulated into the p base region 3 (accumulating operation). Subsequently, the portion between the emitter and base is forwardly biased and the voltage generated due to the accumulated holes is read out to the emitter side in the floating state (reading operation). On the other hand, by grounding the emitter side and applying a pulse of a positive voltage to the polysilicon layer 4 as the capacitor electrode, the holes accumulated in the p base region 3 are removed to the emitter side (refreshing operation). After the accumulated holes were removed, the positive voltage pulse to refresh trails. At this time, the p base region 3 becomes the initial state biased to the negative potential.

The reasons why the electrode section is shielded by the light shielding layer 10 are as follows.

When the accumulating operation is performed without providing the light shielding layer 10, the pairs of electrons and holes generated, for example, in the depletion layer between the collector and base (between the $n^-$ epitaxial layer 2 and the p base region 3) by the incident light are attracted by the strong electric field and most efficiently accumulated into the p base region 3 without being recombined. Thus, the photoelectric converting efficiency of the photo sensing section is high.

On the other hand, although the holes generated in the emitter region 5 and element isolating region 6 move to the base region 3 due to the concentration gradient, the recombination ratio is high in the $n^+$ impurities, so that the efficiency such that the holes are accumulated into the base region 3 is low. On one hand, in the case where the electrodes 7 and 15 are formed of metal of the aluminum system, if the thickness is 3000 Å or more, the transmission factor of the light becomes 1/10000 or less. The light transmission factor of the polysilicon layer 4 is also low. Consequently, the photoelectric converting efficiency of the portion just under the electrode is extremely low.

Figure 1A:
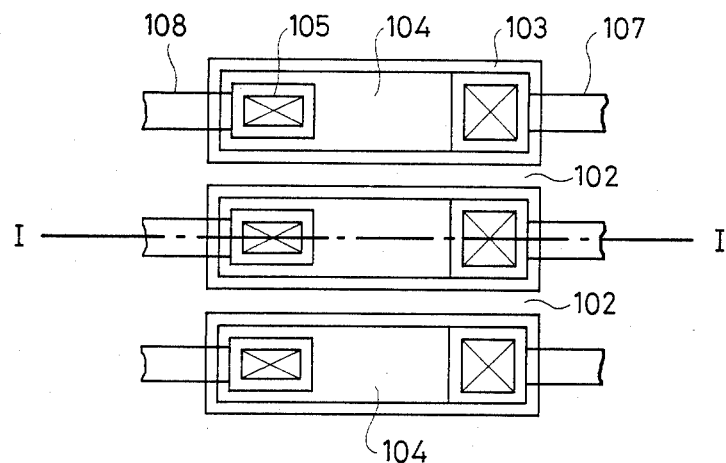
FIG. 1A is a schematic plan view of a conventional photoelectric converting device.
Figure 1B:
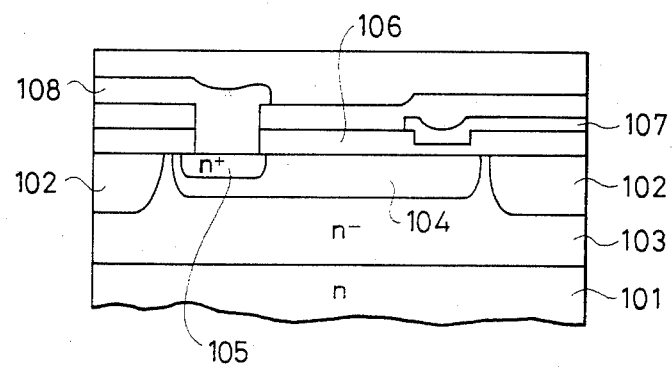
FIG. 1B is a cross sectional view taken along the line I—I in FIG. 1A.

Therefore, in this embodiment, as shown in FIG. 1A, the electrode section having a low photoelectric converting efficiency is provided at one end of the cell. The photosensing section having a high photoelectric converting efficiency is formed so as to have a width narrower than the electrode section. The cells constituted in this manner are alternately arranged in a line, thereby remarkably improving the arrangement density of the photosensing section. However, in such an arrangement, if the light shielding layer 10 is not provided, an output from the electrode section of a low arrangement density is added, so that not only the resolution of the photoelectric converting device deteriorates but also the cells cannot be isolated. Thus, it is inevitable that the electrode section is shielded against the light by the light shielding layer 10.

FIGS. 3A to 3H are diagrams for explaining the manufacturing process of this embodiment.

Figure 3A:
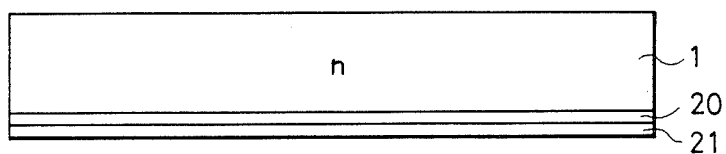
FIGS. 3A to 3H are diagrams for explaining the manufacturing process of the embodiment.

First, as shown in FIG. 3A, an $n^+$ layer 20 for ohmic contact having an impurity concentration of $1 \times 10^{17}$ to $1 \times 10^{20}$ cm$^{-3}$ is formed on the back surface of the n-type silicon substrate 1 having an impurity concentration of $1 \times 10^{15}$ to $5 \times 10^{18}$ cm$^{-3}$ due to the diffusion of P, As, or Sb. Then, an oxide film 21 (e.g., SiO$_2$ film) having a thickness of 3000 to 7000 Å is formed under the $n^+$ layer 20 due to a CVD method.

The oxide film 21 is called back coat and serves to prevent the generation of the impurity vapors when the substrate 1 is subjected to the heat treatment.

Next, the surface of the substrate 1 is etched for about one and half minutes at a temperature of 1000° C. under the condition of HCl of 2 l/min and H$_2$ of 60 l/min. Thereafter, a source gas of SiH$_2$Cl$_2$ (100%) of 1.2 l/min and a doping gas (PH$_3$ diluted by H$_2$, 20 ppm) of 100 ml, for example, are poured and the $n^-$ epitaxial layer 2

Figure 3B:
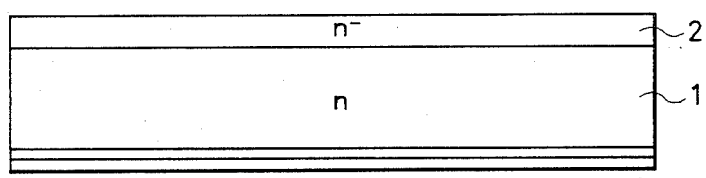

(hereinafter, referred to as the n⁻ layer 2) is formed at a growth temperature of 1000° C. and at reduced pressures of 120 to 180 Torr. In this case, the growth speed of the monocrystal is 0.5 μm/min, the thickness is 2 to 10 μm, and the impurity concentration is $1 \times 10^{12}$ to $10^{16}$ cm$^{-3}$, preferably, $10^{12}$ to $10^{14}$ cm$^{-3}$ (FIG. 3B).

To improve the quality of the n⁻ layer 2, the substrate is first subjected to the heat treatment at temperatures of 1150° to 1250° C. to remove oxygen from the portion near the surface of the substrate. Thereafter, a number of microdefects are generated in the substrate due to the heat treatment for a long time at a temperature of about 800° C., thereby forming the substrate having the denuded zone such that the intrinsic gettering can be carried out. This method is extremely effective to improve the quality of the n⁻ layer 2.

Subsequently, an oxide film 22 for buffer having a thickness of 500 to 1500 Å is formed on the n⁻ layer 2 due to the pyrogeneic oxidation (H$_2$+O$_2$), wet oxidation (O$_2$+H$_2$O), steam oxidation (N$_2$+H$_2$O), or dry oxidation. To further obtain a good oxide film having no stacking fault or the like, it is proper to carry out the oxidation at a high pressure and at temperatures of 800° to 1000° C.

The oxide film 22 is provided to prevent the channeling and surface fault when the base region is formed due to an ion implantation method. By this process, the oxide film 21 of the back coat is completely removed.

Figure 3C:
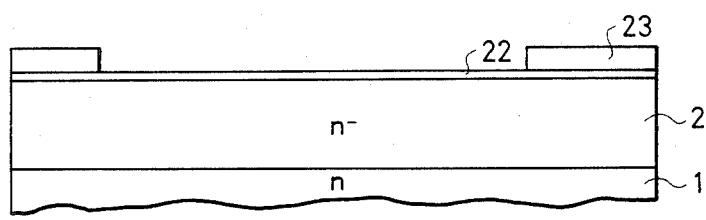

Next, a resist 23 is coated and the portions where the base region is formed are selectively removed (FIG. 3C).

Subsequently, the B+ ions or BF$_2$+ ions produced using BF$_3$ as a source gas are implanted into the wafer. The surface concentration is $1 \times 10^{15}$ to $5 \times 10^{18}$ cm$^{-3}$, preferably, $1-20 \times 10^{16}$ cm$^{-3}$. The amount of ions which are implanted is $7 \times 10^{11}$ to $1 \times 10^{15}$ cm$^{-2}$, preferably, $1 \times 10^{12}$ to $1 \times 10^{14}$ cm$^{-2}$.

Figure 3D:
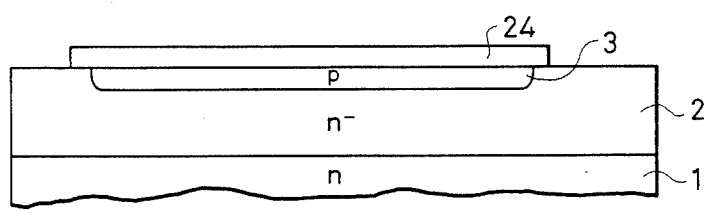

After the ions were implanted in this manner, the resist 23 is removed. Then, the p base region 3 is formed until a predetermined depth due to the thermal diffusion at temperatures of 1000° to 1100° C. and in the N$_2$ gas. At the same time, an oxide film 24 is thickly formed over the surface of the substrate 1. Subsequently, the oxide film 24 of the portions where the element isolating region 6 is formed is selectively removed (FIG. 3D).

The depth of the p phase region 3 is, for example, about 0.6 to 1 μm. However, this depth and impurity concentration are determined on the basis of the following idea.

To raise the sensitivity, it is desirable to reduce the impurity concentration of the p base region 3 and thereby to decrease a capacitance Cbe between the base and emitter. Cbe is nearly given by the following expression.

$$Cbe = Ae\epsilon \left( \frac{q \cdot N_A}{2\epsilon Vbi} \right)^{\frac{1}{2}}$$

where, Vbi is a diffusion potential between the emitter and base and given by the following expression.

$$Vbi = \frac{kT}{q} \ln \frac{N_A N_D}{N_i^2}$$

where, $\epsilon$ is a dielectric constant of silicon crystal; $N_D$ is an impurity concentration of the emitter; $N_A$ an impurity concentration of the portion of the base adjacent to the emitter; $n_i$ an intrinsic carrier concentration; Ae an area of the base region; k a Boltzmann's constant; T an absolute temperature; and q a unit charge amount. As $N_A$ decreases, Cbe is reduced and the sensitivity increases. However, if $N_A$ is set to be too small, the base region is completely depleted in the operating state and becomes the punch through state. Therefore $N_A$ cannot be set to a very small value. It is preferable to set $N_A$ so as to prevent that the base region is completely depleted and becomes the punch through state.

As a method of forming the base region 3, there is also the method whereby BSG is deposited on the wafer and impurities B are diffused until a predetermined depth due to the thermal diffusion at temperatures of 1100° to 1200° C.

Then, a diffusion which causes quality of n+ is performed to form the element isolating region 6 in this case. The concentration is preferably set to $10^{17}$ to $10^{21}$ cm$^{-3}$. As a method, there are the diffusion method from POCl$_3$ and ion implantation method. In this embodiment, the good results were derived by the method using POCl$_3$. The conditions are such that the furnace temperature is 850° to 1000° C., the carrier gas for POCl$_3$ bubble is 50 to 200 ml/min, and the treatment time is 10 to 40 minutes.

Figure 3E:
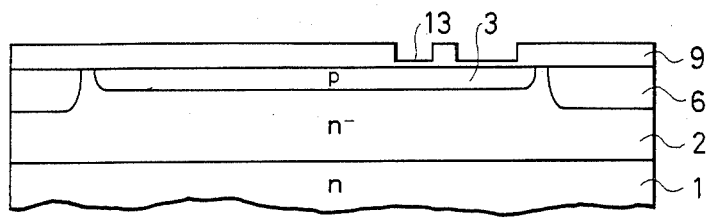

After the element isolating region 6 and base region 3 were formed as described above, a thick oxide film 9 is further formed over the substrate 1 due to the oxidation process. Then, the oxide film 9 of the portion where the capacitor electrode and emitter region are formed is selectively removed and the gate oxide film 13 having a thickness of 100 to 1000 Å is formed (FIG. 3E).

Thereafter, polysilicon doped with As is deposited due to the CVD method by use of the (N$_2$+SiH$_4$+AsH$_3$) or (H$_2$+SiH$_4$+AsH$_3$) gas. The deposition temperature is about 550° to 900° C. and the thickness is 2000 to 7000 Å. It is also obviously possible to preliminarily deposit non-doped polysilicon due to the CVD method and thereafter diffuse As or P. The polysilicon film deposited in this way is partially etched and removed by the photolithography process, thereby forming the polysilicon layer 4 as the capacitor electrode.

Figure 3F:
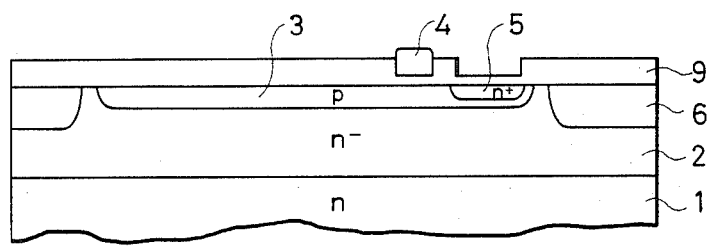

Subsequently, impurity ions of P, As, or the like are implanted through the oxide film into the portion where the emitter region is formed due to the ion implantation method. Then, the heat treatment is carried out to form the n+ emitter region 5 (FIG. 3F).

The emitter region 5 has been formed by the ion implantation method in this embodiment. However, the n+ emitter region 5 may be also formed by the following method. Namely, the oxide film is removed and polysilicon is deposited onto the opening portions simultaneously with the polysilicon layer 4. The impurities of P, As, or the like in polysilicon are diffused into the p base region 3 due to the heat treatment, thereby forming the n+ emitter region 5.

Figure 3G:
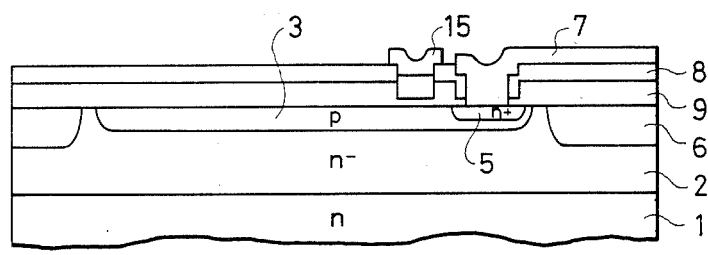
Figure 3H:
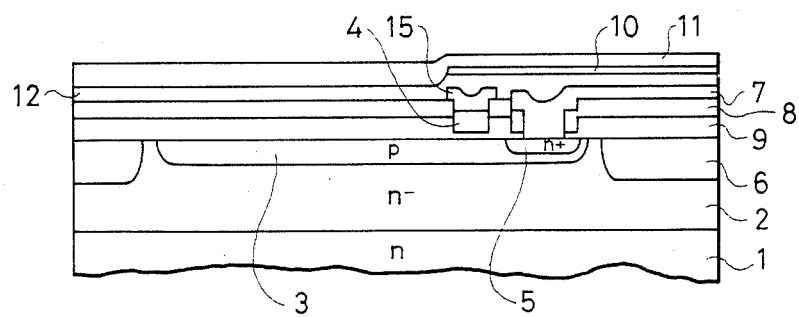

Next, a PSG film or SiO$_2$ film 8 having a thickness of 3000 to 7000 Å is deposited due to the CVD method of the foregoing gas system. Subsequently, contact holes are formed on the polysilicon layer 4 and emitter region 5 due to the mask matching process and etching process. The electrodes 7 and 15 (metal such as Al, Al-Si, Al-Cu-Si, or the like) are formed in the contact holes due to the vacuum evaporation method or sputtering method (FIG. 3G).

Next, an insulating film 12 between layers such as PSG film, SiO$_2$ film, or the like is deposited so as to have a thickness of 3000 to 9000 Å due to the CVD method. Moreover, the light shielding layer (e.g., Al or the like) 10 of a thickness of 2800 to 5000 Å is deposited and the portion of the photo sensing section is etched and removed.

Then, a passivation film 11 (PSG film, $Si_3N_4$ film, or the like) is formed due to the CVD method and a collector electrode (metal of Al, Al-Si, Au, or the like) is formed on the back surface of the wafer. In this manner, the photoelectric converting device shown in FIGS. 2A to 2E is formed.

Although the $n^+$ semiconductor has been used for the element isolating region 6 in the manufacturing process in this embodiment, the invention is not obviously limited to this. In the case of a PNP bipolar transistor, a $p^+$ semiconductor may be used or the elements may be isolated by an insulating material.

FIG. 4 is a schematic plan view of the second embodiment of the invention. As shown in the diagram, the extent of the base region 3 in the photosensing section is smaller than that in the first embodiment.

As set forth in the Official Gazette of EPC Application Laid-Open No. 0132076, in the photoelectric converting device of such a system, in the case where a voltage Vr is applied to the capacitor electrode 4, a variation in base potential is expressed as follows.

$$\frac{Cox}{Cox + Cbe + Cbc} \times Vr$$

where, Cox is a capacitance of the capacitor, Cbe is a capacitance between the base and emitter, and Cbc is a capacitance between the base and collector. As will be understood from this expression, it is desirable to set the capacitance Cbc of the depletion layer between the base and collector to a small value in terms of an increase in output voltage. Therefore, in this embodiment, the extent of the base region 3 is reduced. However, the point with regard to a degree of extent of the base region 3 needs to be determined in consideration of a capture efficiency of the carriers which are generated, an output voltage, and the like.

FIG. 5 is a schematic plan view of the third embodiment of the invention. In the first and second embodiments, the photosensor cells were arranged in a line and the emitter electrode 7 and electrode 15 were alternately drawn from both sides of the photosensing surface for each cell. However, as shown in FIG. 5, it is also possible to use the constitution such that the electrode sections of the adjacent cells are deviated to the front and back and the adjacent electrodes 7 and 15 and adjacent electrodes 7' and 15' are drawn from the same side.

However, in this embodiment, the $n^-$ layer 2 as the photosensing section of the cell locating backward and the $n^-$ layer 2 of the electrode section are connected by a wiring 16. The photosensing section consists of only the $n^-$ layer 2 and the base region 3 is formed in the electrode section.

In the shape of the cell shown in FIG. 5, the electrodes may be obviously drawn from both sides for every cell.

As described in detail above, in the photoelectric converting device according to the embodiments, the dimensions of the device can be reduced without being limited by the design rule and a high resolution can be easily attained. For example, even in the case of using the design rule of 2 μm as well, according to the invention, the width of cell can be reduced to 5 μm from 10 μm in the conventional device. Even if 1000 elements are arranged as well, the length of the photoelectric converting device itself can be set to 5 mm without deteriorating the photoelectric converting characteristic.

What is claimed is:

1. A photoelectric converting device comprising a plurality of photoelectric converting cells which are arranged and each of which has:
    a semiconductor transistor consisting of two main electrode regions formed of a semiconductor of one conductivity type and a control electrode region formed of a semiconductor of the opposite conductivity type; and
    a capacitor for controlling a potential of said control electrode region in the floating state,
    wherein each of said photoelectric converting cells accumulates carriers generated due to an incident light into said control electrode region and controls an output by a voltage generated due to said accumulated carriers by controlling the potential of said control electrode region in the floating state through the capacitor,
    and each of said photoelectric converting cells consists of a first portion having a high photoelectric converting efficiency and a second portion including at least an electrode of said capacitor and an electrode of the other main electrode regions, and a width of said first portion is formed narrower than a width of said second portion and said first portion is arranged in a line.

2. A photoelectric converting device according to claim 1, wherein light shielding means is provided on said second portion and only the first portion arranged in a line serves as the photosensing surface.

* * * * *